United States Patent [19]

Arzubi et al.

[11] 4,276,487

[45] Jun. 30, 1981

[54] FET DRIVER CIRCUIT WITH SHORT SWITCHING TIMES

[75] Inventors: Luis M. Arzubi; Rainer Clemen, both of Boeblingen; Jörg Gschwendtner, Esslingen, all of Fed. Rep. of Germany

[73] Assignee: International Business Machines Corporation, Armonk, N.Y.

[21] Appl. No.: 27,128

[22] Filed: Apr. 4, 1979

[30] Foreign Application Priority Data

Apr. 19, 1978 [DE] Fed. Rep. of Germany ....... 2816980

[51] Int. Cl.³ .................... H03K 17/04; H03K 17/284; H03K 17/687; H03K 19/017
[52] U.S. Cl. .................................... 307/270; 307/481; 307/482; 307/582
[58] Field of Search ............... 307/205, 214, 251, 270, 307/293, DIG. 4

[56] References Cited

U.S. PATENT DOCUMENTS

| | | | |
|---|---|---|---|
| Re. 27,305 | 3/1972 | Polkinghorn et al. ..... | 307/DIG. 4 X |
| 3,631,267 | 12/1971 | Heimbigner ......................... | 307/270 |
| 3,714,466 | 1/1973 | Spence ...................... | 307/DIG. 4 X |
| 3,769,528 | 10/1973 | Chu et al. .......................... | 307/293 X |
| 3,806,738 | 4/1974 | Chin et al. ....................... | 307/251 X |
| 3,898,479 | 8/1975 | Proebsting ................ | 307/DIG. 4 X |
| 4,061,933 | 12/1977 | Schroeder et al. .............. | 307/270 X |
| 4,063,117 | 12/1977 | Laugesen .............................. | 307/270 |
| 4,122,361 | 10/1978 | Clemen et al. .................... | 307/251 X |

OTHER PUBLICATIONS

Arzubi et al., "MOS Driver with Internal Feedback", *IBM Tech. Discl. Bull.*, vol. 19, No. 10, pp. 3765-3766, 3/1977.
Kalter et al., "Field-Effect Transistor Driver Circuit", *IBM Tech. Discl. Bull.*, vol. 18, No. 4, pp. 1028-1029, 9/1975.
Arzubi, "In-Phase Driver Circuit", *IBM Tech. Discl. Bull.*, vol. 19, No. 1, pp. 31-32, 6/1976.
Anderson et al., "FET Inverter and Driver", *IBM Tech. Discl. Bull.*, vol. 16, No. 1, pp. 50-51, 6/1973.

*Primary Examiner*—Larry N. Anagnos
*Attorney, Agent, or Firm*—Howard J. Walter, Jr.

[57] ABSTRACT

A field effect transistor driver circuit responsive to a single input pusle generates a highly loadable output clock pulse with short rise and fall times, the rising edge being shifted relative to said input pulse by a controllable delay time but the trailing edge remaining practically undelayed. This advantageous pulse form is achieved through an improved controlling of a bootstrap output stage. Two preceding stages, i.e., a transmission gate and a delay stage supply two out-of-phase control pulses with high amplitudes and steep edges. Of essential importance is the novel delay stage which is designed as push-pull stage with a load FET and a driver FET. The gate of the load FET is controlled by the output pulse of the bootstrap stage 2 fed back via a third FET and by a capacitively coupled-in input pulse at the drain, whereas the gate of driver FET is controlled from the bootstrapped output of the transmission gate. The connecting point of load and driver FET represents the output of the delay stage. For the quick switching-on and delayed but speedy switching-off of the driver FET's of the bootstrap output stage a pulse equal in amplitude to the input pulse is generated. That pulse rising with equal speed and falling steeply after delay. The delay stage also controls advantageously the gate recharging of the isolation FET of transmission gate.

13 Claims, 3 Drawing Figures

FET DRIVER CIRCUIT WITH SHORT SWITCHING TIMES

BACKGROUND OF THE INVENTION

1. Field of the Invention

The invention relates to a field effect transistor driver circuit.

2. Description of the Prior Art

In general, it is the object of such driver circuits to supply at a predetermined moment, without considerable power dissipation of its own, a relatively high output current which is required at the output for driving a load capacitance which is large compared with the input capacitance.

Particularly in highly integrated digital circuits there is a problem of generating, out of one single externally applied clock pulse, a series of further (internal) pulses whose succession with respect to time is predetermined by the operation of the overall circuit. The requirements of such a single driver circuit generally consist of providing a pulse of a predetermined form which, relative to the predetermined input pulse, is delayed by a defined time and which also shows a short rise and/or fall time. Contrary to the input pulse source, a high current driving capacity is required of the output pulse, i.e., it has to be loadable with a high capacitance which in monolithically integrated semiconductor circuits, particularly FET circuits, is formed by the inputs of subsequent circuits to be driven and their interconnecting lines.

Driver circuits with field effect transistors are known in a multitude of designs already. The following literature references can be considered to be representative for prior art in this field: U.S. Pat. Nos. 3,631,267; 3,769,528, 3,898,479 and 4,061,933, as well as the publications in the *IBM Technical Disclosure Bulletin*, Vol. 16, No. 1, June 1973, pages 50/51; Vol. 17, No. 10, March 1975, page 2834; Vol. 18, No. 4, September 1975, pages 1028/1029 and Vol. 19, No. 1, June 1976, pages 31/32.

The circuit of FIG. 1 can be considered the typical prior art for the fundamental structure of a driver circuit which is the basis for the invention to be described below. The fundamental circuit structure shown there which consists of several partial circuits is known, e.g., from U.S. Pat. No. 4,122,361 with further references.

SUMMARY OF THE INVENTION

It is an object of the invention to further improve a driver circuit of the above described type designed with field effect transistors with respect to a shorter rise and fall time of the output pulse. The circuit to be specified is easily integratable monolithically and does not involve an excessive number of devices.

In summary, an FET driver circuit is described in which a single input pulse generates a highly loadable clock pulse with a short rise and fall time, where in relation to the input pulse the rising edge is delayed by a predetermined time but the trailing edge is practically undelayed.

This advantageous pulse form is achieved by an improved control of the bootstrap output stage. The two pre-stages, i.e., the transmission and the delay stage, provide two out-of-phase control pulses with higher amplitude and steeper edges.

Of particular importance is the novel control of the delay stage which in a manner known per se is designed as a push-pull stage with a load FET and a driver FET. There, the gate of the load FET is controlled with the output pulse of the end or output stage of the driver, said output pulse being fed back via a further FET, with the capacitively coupled-in input pulse at its drain. The gate of the driver FET is controlled by the output of the transmission stage and thus with the bootstrap voltage. The point of connection of load and driver FET represents the output of the delay stage. For the speedy switching-in and delayed, but speedy switching-off of the driver FET's of the end stage an amplitude-like pulse is generated from the input pulse, which rises with equal speed and drops steeply after delay. According to an advantageous development, the delay stage also controls the gate precharge of the transfer/isolation FET in the transmission stage.

These and other objects, features and advantages of the invention will be apparent from the following more particular description of the preferred embodiments of the invention as illustrated in the accompanying drawings.

DESCRIPTION OF THE PREFERRED EMBODIMENTS

Figure 1:
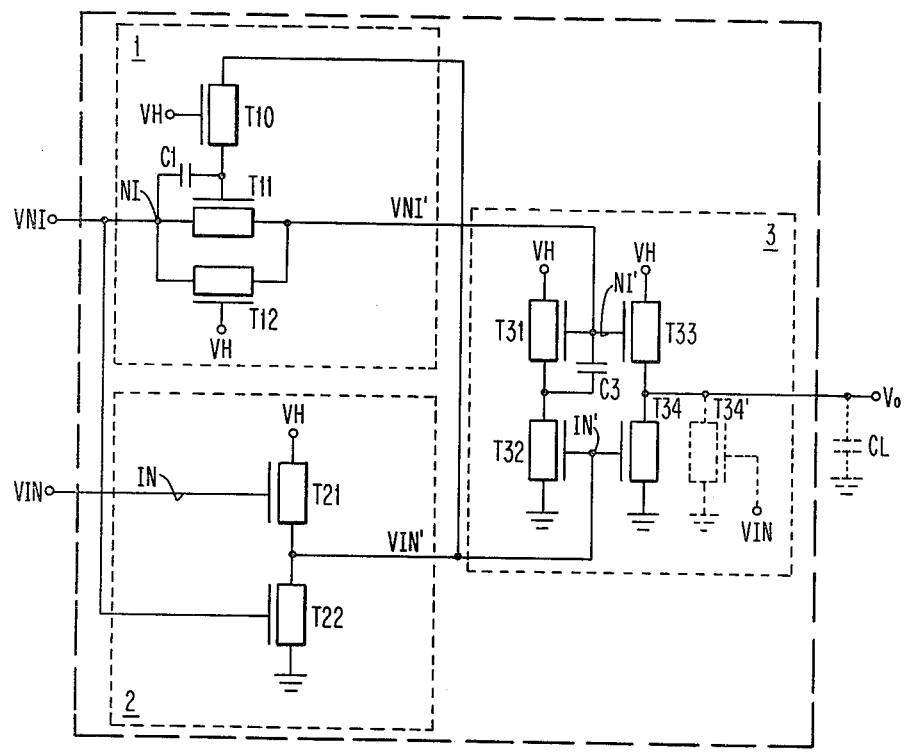
FIG. 1 is a schematic drawing of an FET driver circuit typical of the prior art.

FIG. 1 shows a driver circuit which in its fundamental structure is typical for the above mentioned prior art, and which forms the basis of the invention.

The block diagram of FIG. 1 shows that the entire driver circuit comprises the two pre-stages 1 and 2, as well as output stage 3. The first pre-stage 1 controls the non-inverted input node (NI') of output stage 3 and serves as a transfer or isolation stage for the recharging or decoupling, respectively, of the common gate connection of load transistors T31 and T33, and of bootstrap capacitor C3 connected thereto. The second pre-stage 2 controls the inverting input node (IN') of output stage 3, and thus executes direct control of the interconnected gates of driver transistors T32 and T34. With respect to a major delay time of the overall circuit, pre-stage 2 is designed as delay stage, i.e., in the most simple case as indicated in FIG. 1, it is equipped with a load transistor T21 and with a high impedance driver transistor T22.

Output stage 3 represents the actual driver stage. This is a bootstrap circuit arrangement fundamentally known per se, in which a feedback capacitor C3 is provided in a similar pre-stage (T31, T32) which is arranged in parallel to the output stage (T33, T34) and not loaded externally. Apart from the overlap phase which is required for charging C3, as well as the gates of T31 and T33, during which the two driver transistors as well as the two load transistors are conductive, both stages of output stage 3 can be considered push-pull stages. The end stage thus represents a push-pull stage with an unsaturated load transistor T33 whose gate is controlled with the capacitively increased pulse VNI'. This pulse is inverted with respect to pulse VIN' applied to driver transistors T32 and T34, and is generated at the gate of load transistor T31 of the non-loaded pre-stage by means of a feedback via loaded bootstrap capacitor C3.

The basic function of a driver circuit of the type shown in FIG. 1 can be considered known. Below, detailed reference will only be made to some of the disadvantages involved.

I. Late and shallow downward slope of the output pulse Vo
  because after the rise of input pulse VIN output driver transistor T34 is switched on with a delay, because the discharge of the load capacitance CL via T34 starts only when the gate voltage of T34 has exceeded its threshold voltage. This gate voltage in turn begins to rise only after VIN has reached the value of the threshold voltage of load transistor T21 of prestage 2. Output voltage Vo therefore remains unchanged until input voltage VIN has risen to the sum of the thresold voltages of T34 and T21.
  another reason is that the control voltage for output driver transistor T34 has a maximum amplitude of VH-VT because load transistor T21 for charging the gate of T34 operates in a saturated range exclusively.

This advantage can be avoided in that at the output of the circuit in parallel to T34 another discharge transistor T34', indicated in dashed lines in FIG. 1, is provided which would have to be controlled by VIN. However, this additional field effect transistor would then have to be almost as large as T34, which would mean a considerable increase of space requirements for the circuit.

II. Flat upward slope of output pulse Vo, i.e.:
  in the lower part because the clamping of the output Vo is discontinued too early. The gate voltage at T34 begins to decrease when VNI has exceeded the threshold voltage of T22, i.e., at a time when the precharging of C3 and of the gates of T31 and T33 has just begun. Thus, T34 reaches a higher impedance state at a relativey early time. Depending on the current supplied by T33 there may be a considerable voltage drop at Vo.

In the upper part because the precharging of the bootstrap capacitance C3 is not at an optimum, particularly with a short delay time between VNI and Vo, for the gate voltage at T32 also begins to fall after VNI has reached the threshold voltage of T22. Depending upon the charging current of T31 the potential of the drain of T32, and of the electrode of C3 connected thereto, rises gradually, although the precharging of C3 is not yet terminated. Furthermore, in spite of capacitive incoupling of VNI, T11 does not transmit pulse VNI with sufficient speed to C3 as the gate of T11 had been precharged via T10 on the one hand to a voltage below VH-VT, and on the other the gate of T11 is discharged too quickly during the VNI rise time by T22 which becomes conductive at an early time. As during the charging phase, T10 operates exclusively in the unsaturated range since its drain potential can at most reach VH-VT. With a lower precharge of C3 a correspondingly lower control voltage is available at load transistor T33 during the bootstrap process.

Another disadvantage of the circuit of FIG. 1 is that the threshold voltage of driver transistor T34 is passed through by gate voltage VIN' at a relatively low speed, and if T34 continues to be conductive over an extended period load transistor T33 carries not only a capacitive but also an ohmic load.

Figure 2:
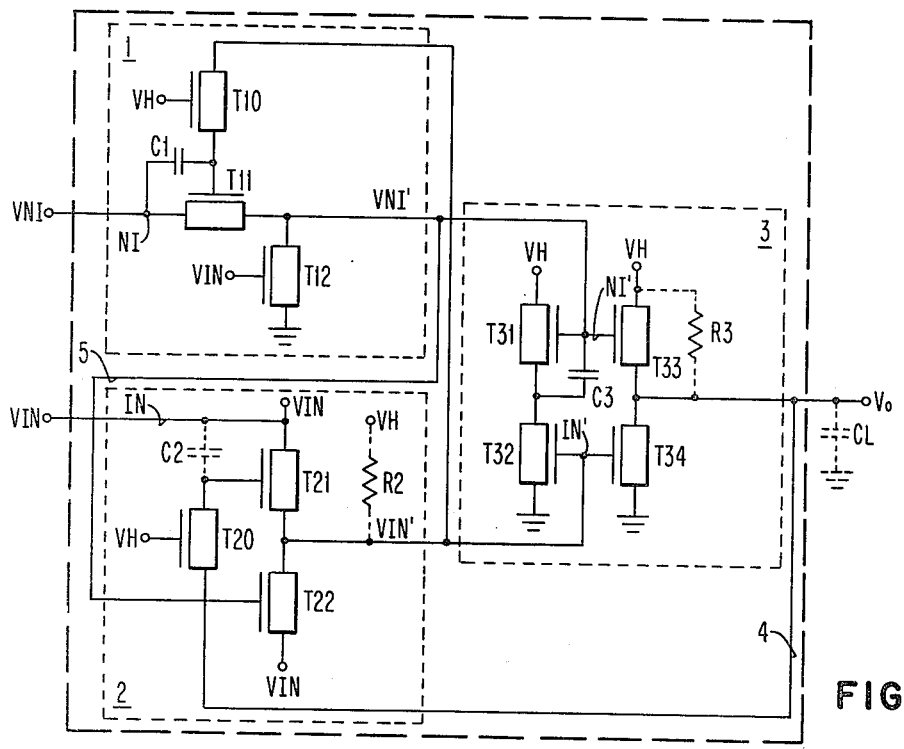
FIG. 2 is a schematic drawing of a first embodiment of the driver circuit improved in accordance with the invention.

A first embodiment of the improved driver circuit is shown in FIG. 2. As far as possible in this circuit, partial circuits or components corresponding to those of the circuit in FIG. 1 have the same reference numbers. In its fundamental structure the driver circuit of FIG. 2 also comprises a first prestage 1 designed as transmission stage, a second pre-stage 2 designed as delay stage, and output stage 3.

Delay stage 2 is designed as push-pull stage or as a dynamic inverter with a load transistor T21 and a driver transistor T22. With respsect to the control, however, it differs substantially from the circuit of FIG. 1. First, the gate of T21 is no longer coupled directly to the inverting input node IN of the overall circuit, but is capacitively coupled via the gate-drain capacitance C2. The biasing of T21 is obtained by means of a feedback from the output of end stage 3 via the line 4 and transistor T20. Second, the gate of T22 is no longer connected to the non-inverting input node NI of the overall circuit direct, but in order to increase the delay it is connected indirectly by means of line 5 from transmission stage 1. Thus, the gate of T22 is also connected to bootstrap capacitor C3 of output stage 3 so that the total effect achieved is a delayed gate voltage which towards its end is dynamically boosted.

Since two out-of-phase pulses are required for controlling bootstrap end stage 3 which operates in accordance with the push-pull principle, there accordingly exists two different basic ways or modes of operating the driver circuit. Depending on whether the input pulse is applied to the NI or the IN input nodes, the respective other input being controlled out-of-phase, there appears at the output a non-inverted or an inverted output pulse Vo. The control pulse for the respective other input is generated in an advantageous development according to the circuit of FIG. 4, which will be described below, from the actual input pulse by means of another high-speed inverter circuit known per se.

The basic structure of the circuit of FIG. 2 is the same for both modes of operation, apart from resistor R2 for the non-inverting type, or R3 for the inverting driver, which are merely required for initialization upon the switching-on of the supply voltage VH. Therefore, the following description of the invention will be restricted to the case of the inverting driver.

For explaining the specific control and the mode of operation of the improved circuit according to FIG. 2 the case of the inverting driver will therefore be studied, where input pulse VIN is to be applied to the input marked IN. The associated detailed pulse diagram is shown in FIG. 3.

Figure 3:
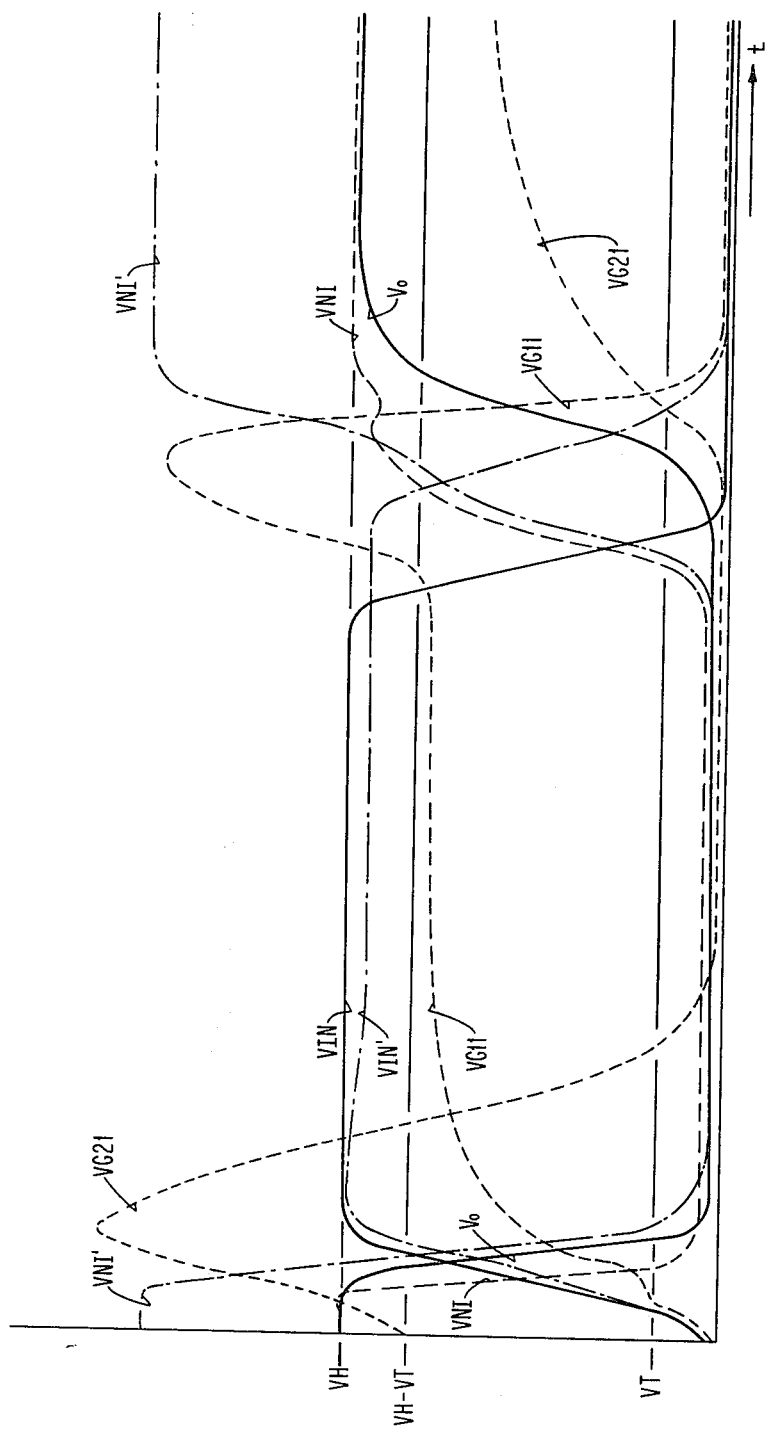
FIG. 3 is a graphic representation of some waveforms of the circuit of FIG. 2 to explain the operation of the circuit.

In the pulse diagram of FIG. 3 it is assumed that until time t=0 the circuit is in the standby state. When input node IN is on a low potential (VIN=0V) the output is maintained on a high potential (Vo=VH) via resistor R3, i.e., the output voltage level is inverted with respect to the input voltage level. The respective conditions are the following. Owing to the feedback from the output via the forward conducting transistor T20, the gate electrode of T21 is charged to VH-VT so that the gates of T32 and T34, as well as (via the backward conducting T10) the gate of T11, are maintained at ground potential (in accordance with VIN=0V) by the input through conductive transistor T21. Accordingly, the two driver transistors T32 and T34 of output stage 3 are in the non-conductive state, whereas owing to the non-conductive transistor T11 of the transmission stage 1 the two load transistors T31 and T33 are isolated from the (second) input node NI with VNI=VH. Since T12 is non-conductive, the gates of T31, T33 and T22 can therefore have any potential between VNI and 2VH. The source of T31 can be between zero and VH.

If at time t=0 input pulse VIN increases from the lower (0V) to the upper (VH) voltage level the gate voltage at load transistor T21 is increased, by means of coupling from the input via the (possibly additioally enhanced) drain-gate capacitance C2, to $VH+VT<VG21<2VH-VT$. Since T21 during the increase of VIN does not pinch off and as its high intial conductivity almost remains intact, output voltage VIN' at pre-stage 2 very quickly follows input voltage VIN and also reaches its amplitude VH. As soon as VIN or VIN', respectively, have exceeded the value of threshold voltage VT of T34 the discharge of load capcitance CL begins via the very low impedance output driver transistor T34.

At the same time, load transistors T31 and T33 in output stage 3 whose gates had previously been floating (VNI'<2VH) are quickly switched off by discharge transistor T12. Thus reducing any excess flow of current from VH to ground when T31 and T32 and T33 and T34 are conductive simultaneously. Together with the discharge of the gates of T31 and T33, T22 which previously had been conductive during a short period (at least during VIN<VT) and which thus supported the charging of the gates of T32 and T34, changes into the non-conductive state, too.

Finally, with a rising input voltage VIN there begins via T10 which is now forward-conductive, the charging of the gate of T11 of transfer stage 1. However, owing to the negative feedback via C1, the gate voltage of T11 is soon reduced again temporarily, i.e., if the second input pulse VNI drops from its upper value VH to the lower level (0V), as soon as VIN≦VT. However, while VNI=0V and VIN=VH, coupling capacitor C1 (required for the pulse transmission later on), as well as the gate of T11 can nevertheless be safely charged to VH-VT as T10 now operates continuously in the saturated range, and therefore supplies enough current.

After output voltage Vo has reached a level below value VH-VT, T20 begins to be backward-conductive, with the gate of T21 discharging slowly via T20 and T34. Before input pulse VIN reaches the lower level again, T21 becomes non-conductive.

At the end of the VIN pulse phase with VIN=VH, and VNI=0V, there exists the following quasi-stationary status: the highly conductive driver transistors T32 and T34 of the end stage with a gate voltage VH connect the source of T31 and the output (Vo) to ground potential, with a low current flowing via the high impedance load resistor R3 which had been required for initializing the circuit. Transmission transistor T11 whose gate is charged via the forward-conductive T10 to VH-VT maintains, together with the equally switched on T12, the two load transistors T31 and T33 of the end stage, as well as driver transistor T22 of the delay stage in the nonconductive state. Load transistor T21 of the delay stage is switched off, too, since at its gate a low potential is applied from the output Vo via the backward conductive T20. Thus, the gates of T32 and T34, as well as of T11 are isolated from any voltage source, but fully charged and thus prepared for the subsequent VNI pulse phase.

If input pulse VIN drops from the upper (VH) to the lower (0V) level, T12 changes into the non-conductive state so that the second input pulse VNI (generated out of VIN with an inverter) can rise quickly. During the rise time of VNI the feedback capacitor C3 and thus also the gates of load transistors T31 and T33 of the end stage are charged via transmission stage 1 which is then forward-conductive. For that purpose, voltage VNI is superimposed for a short time, at the gate of T11, on the precharged bias VH-VT by means of capacitive coupling via C1, so as to make sure that T11 does not lose its high initial conductivity, and that output voltage VNI' quickly follows input voltage VNI. At the same time, the still highly conductive T32 keeps the electrode of C3 which is connected to the drain of T32 at a low potential. Only when input voltage VIN has decreased to such an extent, and when the second input voltage VNI, or output voltage VNI' of transmission stage 1 have increased to such an extent that the gate-source voltage at the high impedance driver transistor T22 of delay stage 2 is higher than the threshold voltage of T22 does the discharge of the gates of the output driver transistors T32 and T34 begin. Until the time when VNI has almost reached the end value, however, T32 is still sufficiently conductive so that at bootstrap capacitor C3 almost the maximum bias VH is applied.

With advancing time, the discharge current through T22 increases, the gate voltage at T32 continues to decrease, the source potential of T31 increases and there appears the known bootstrap effect, i.e., the gate potential of load transistors T31 and T33 of end stage 3 increases owing to the capacitive feedback via C3 to the same extent as the increase of the source potential of T31. During the bootstrap action, transmission stage 1 performs an isolating function to make sure that no charge flows from the gates of the load transistors, or from C3, to the NI input node, because at this time the gate electrode of T11 has already been discharged below the value VH+VT via the backward-conductive T10. The high voltage VNI' produced by the bootstrap effect is also applied to the gate of driver transistor T22 of delay stage 2.

Thus, T22 which initially had been of high impedance gradually increases its conductivity. Toward the end therefore the gate voltage of driver transistors T32 and T34 of the end stage decreases rapidly; threshold value VT in particular is passed through very quickly. Consequently, there disappears quickly the ohmic load effect for load transistors T31 and T33 so that there remains a capacitive load only. The remaining build-up of boosted voltage VNI' is then accelerated so that the rise time of output pulse Vo is correspondingly short. With the rise of Vo there begins the charging of the gate of T21 via T20 which is now forward-conducting. At the end of this charge process therefore the initial state has been reached again.

Therefore, the above described improved operation characteristics of the driver circuit in accordance with FIG. 2 compared with the circuit of FIG. 1 is mainly achieved in that driver transistors T32 and T34 of bootstrap end stage 3 are controlled from the inverting input (IN') with a pulse having higher amplitude and at the same time having steeper edges.

For generating this pulse VIN', delay stage 2 shows a specific structure, i.e., it is designed as a dynamic inverter, or as a push-pull stage, respectively. Delay stage 2 contains a load transistor T21 as well as a driver transistor T22 which are controlled at their gates by out-of-phase dynamically increased control voltages, and whose common point of connection represents the stage output. The delay stage further comprises an additional transistor T20 which controls the gate potential of load transistor T21.

For that purpose, the following steps are provided according to the invention:

1. The drain electrode of load transistor T21 is directly connected to the input node IN of the overall circuit. The gate of T21 is, on the one hand, coupled to the same input via the inherent and, if necessary, increased drain-gate capacitance C2, and on the other hand via the transistor T20 controlled by constant operation voltage VH and by feedback line 4 to the output of end stage 3 in such a manner that the following conditions apply for the control voltage at T21. With a low input level VIN=0V, or with a high output level Vo=VH the gate voltage for T21 is preset to an initial value VH-VT. During the rise of input pulse VIN the gate voltage at T21 is dynamically increased by means of capacitive in-coupling, so that load transistor T21 which now operates in the unsaturated mode supplies at its source, for charging the gate of driver transistors T32 and T34 of end stage 3, an output pulse VIN' which quickly follows input pulse VIN and which has the same amplitude. Finally, with a high input level VIN=VH, i.e., after charging of the gates of T32 and T34, or with a low output level Vo=OV, the gate voltage at T21 is reduced to such an extent that load transistor T21 is rendered non-conductive at the latest when the gates of T32 and T34 begin their discharge via driver transistor T22.

2. The source electrode of driver transistor T22 is connected either to ground potential, or in an advantageous development also to input VIN of the overall circuit. The gate of driver transistor T22, on the other hand, is coupled to the output of transmission stage 1 (the non-inverting input NI' node of end stage 3) and to bootstrap capacitor C3. Thus, it receives, as the actual input pulse VNI' of the inverter, the control voltage generated there (mainly for controlling the load transistors of end stage 3) and is dynamically boosted at the end, so that driver transistor T22 which initially had been of a relatively high impedance causes, after the delay time, a speedy switch-off of driver transistors T32 and T34 of end stage 3.

Compared with the conventional circuit in accordance with FIG. 1, these circuit design details result in the following advantageous characteristics:

1. Early decrease and short fall time of output pulse Vo. This is achieved by using the very low-impedance output driver transistor T34 as a discharge transistor, and by controlling T34 with a gate voltage VIN' which rises more steeply and has a higher amplitude. In other words, the load transistor T21 of delay stage 2 is operated as a source follower in the unsaturated zone of its characteristic so that the rising edge of input pulse VIN can pass to the upper level VH without any noticeable delay, and that it practically acts directly on T34. Consequently, a gate voltage at T34 is available very soon, i.e., immediately upon the rise of VIN, thus, discharge of load capacitance CL starts as soon as input voltage VIN has reached threshold voltage VT. Between output pulse Vo and input pulse VIN therefore there is only a short overlapping time so that in dynamic circuits of the inverter type which are controlled by these out-of-phase pulses (e.g., Vo at the load transistor, and VIN at the driver transistor) direct current can flow for a short time only between the supply voltage VH and ground. Thus, the large discharge transistor (T34' in FIG. 1) which had hitherto been additionally required and which in the integrated circuit design would require a great amount of space, is no longer necessary.

2. Short rise time of output pulse Vo (even at a longer delay time).

The switching threshold of delay stage 2 is shifted when controlling the driver transistor T22 with the output voltage VNI' of the transmission stage, and the delay of T11 is thus utilized. Furthermore, if input pulse VIN is applied to the source of T22, the latter becomes conductive only when VIN has decreased by the threshold voltage of T22 below the gate potential. The short rise time of output pulse Vo can also be reached by increasing the conductivity of transmission transistor T11, with an improved precharge of the gate via T21 and T10 which already at the beginning of the VIN pulse phase shows the drain potential VH so that bias VH-VT is reliably obtainable. Finally, another factor which contributes to the conductivity of transmission transistor T11 is the delayed discharge of the gate of T11 via T10 and T22 so that there is a higher voltage boosting. Since on the one hand the discharge of the gate of T32 via T22 begins later so that the C3 electrode connected to the drain of T32 is connected to ground potential for a longer period, and since on the other hand transmission gate 1 permits a better transfer of input pulse VNI a higher bias (VH) can form with greater speed at C3 during the VNI rise. Therefore, a higher gate voltage VNI' is obtained at load transistor T33 at the end of the bootstrap process, with the effect that load capacity CL is charged more quickly.

Apart from the higher charging of the feedback capacitor C3, there also is a stronger discharging of the gate of T34 of the end stage. This is due on the one hand to the operation of load transistor T21 of delay stage 2 as a source follower in the unsaturated mode of its characteristic, so that the gate of T34 is charged to a voltage which almost equals the amplitude of input pulse of VIN. Another decisive factor is the control of driver transistor T22 of delay stage 2 with the boosted voltage VNI' generated by the bootstrap effect at feedback capacitor C3, so that the initially highly ohmic T22 becomes highly conductive during the bootstrap process, and quickly switches off T34. Gate voltage VIN' decreasing from the high value VH, therefore passes very quickly the switching threshold of T34, i.e., the initially high clamping of the output is speedily discontinued. Consequently, load capacity CL can be quickly charged.

3. Low power dissipation of the delay stage. This is achieved in that no direct curent can flow at any time through the series arrangement from load transistor T21 and driver transistor T22, because the drain of T21 and the source of T22 are at any time on the same potential. Consequently, input pulse source VIN is loaded by the delay stage never ohmically but merely capacitively.

Figure 4:
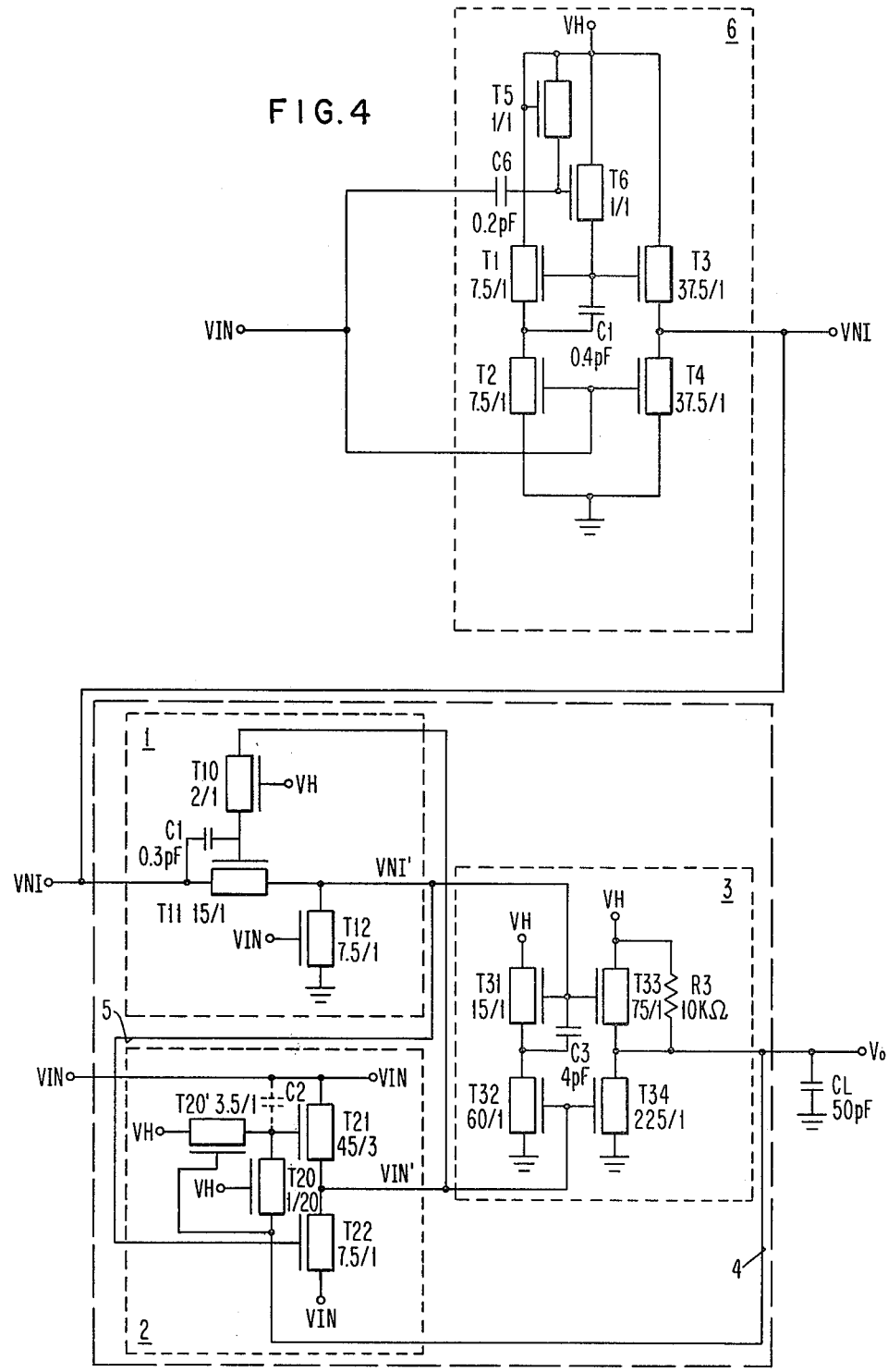
FIG. 4 is a schematic drawing of another embodiment of the invention.

FIG. 4 shows another embodiment of the improved driver circuit, with definite design parameters being given for the components used. These include in particular the width/length data (W/L) of the field effect transistors characterizing the respective transistor geometry, or the capacitor values. As a further development of the circuit of FIG. 2, FIG. 4 shows an additional switching stage 6 for generating the VNI pulse.

This additional switching stage has already been referred to in the above description. Furthermore, FIG. 4 comprises another advantageous embodiment of delay stage 2.

Switching stage 6 provided for generating the VNI pulse represents a high speed bootstrap inverter circuit which is basically known per se, see *IBM Technical Disclosure Bulletin*, Vol. 17, No. 10, age 2834, March 1975, and which with regard to its general structure and operation can be compared with output stage 3, and to which no further explanation need be given. Therefore, only one single externally applied input pulse, in the present case VIN, has to be provided for operating the overall circuit.

The advantageous variation in delay stage 2, in the form of the additional field effect transistor T20', is of advantage particularly in the realization of shorter Vo pulse times. In this case, T20' serves to support T20 in the charging and discharging of the gate of T21. If T20 alone were provided it would need a lower impedance for generating the gate bias VH-VT during the Vo pulse phase than during the in-coupling phase of VIN. Therefore, the embodiment of FIG. 4 provides an additional field effect transistor T20' for charging the gate of T21, apart from T20, which is now of a higher impedance design for discharging the gate of T21.

Finally, it should be noted that the invention is not limited to the conditions of the actual embodiments. To give an example: as far as N-channel field effect transistors are provided, P-channel transistors can be used if the voltage polarities have been adapted accordingly. Furthermore, as far as the terms charging and discharging have been used discharging can correspond to charging to, e.g., negative voltage values. The capacitances mentioned in the description of the embodiments can also be component-inherent, distributed capacitance, or discrete capacitors, or mixed forms thereof. Similarly, time, voltage, and component data are given as examples only.

While the invention has been particularly shown and described with reference to the preferred embodiments thereof, it will be understood by those skilled in the art that various changes in form and details may be made therein without departing from the spirit and scope of the invention.

What is claimed is:

1. A driver circuit including a plurality of field effect transistors, each having a gate and first and second current conducting electrodes, said driver circuit including a transmission stage and a delay stage responsive to two out-of-phase input signals and having their outputs coupled to the inputs of a bootstrap push-pull output stage to provide an output signal on a driver circuit output node, the delay stage including a load transistor and a driver transistor having a first one of their current conducting electrodes connected to provide a delay stage output node, the improvement comprising:
   means for coupling one of said out-of-phase input signals to the second current conducting electrode of said load transistor;
   feedback means connecting said circuit output node to the gate of said load transistor; and
   means for connecting the output of said transmission stage to the gate of said driver transistor.

2. The driver circuit of claim 1 wherein said feedback means comprises a field effect transistor having its current conducting electrodes connected between said circuit output node and the gate of said load transistor and having its gate connected to a fixed bias.

3. The driver circuit of claim 1 further including a field effect transistor having its gate connected to said circuit output node and its current conducting electrodes connected between the gate of said load transistor and a fixed bias.

4. The driver circuit of claim 1 wherein there is provided an increased capacitance between said second current conducting electrode and the gate of said load transistor.

5. The driver circuit of claim 1 wherein said one of said out-of-phase input signals is coupled to the second current conducting electrode of said driver transistor.

6. The driver circuit of claim 1 wherein the other of said out-of-phase input signals is derived from said one out-of-phase input signal and a bootstrap inverter circuit.

7. A driver circuit including a plurality of field effect transistors, each having a gate and first and second current conducting electrodes, comprising:
   first input node responsive to a first input signal;
   second input node responsive to a second input signal;
   an output node;
   first and second serially connected field effect transistors connected between a source of supply potential and having their common connection connected to said output node;
   a third field effect transistor having its first current conducting terminal connected to said first input node, its second current conducting terminal connected to the gate of said first field effect transistor and its gate coupled to the gate of said second field effect transistor;
   a fourth field effect transistor having its first current conducting terminal connected to said second input node, its second current conducting terminal connected to the gate of said second field effect transistor and its gate coupled to said output node by a feedback path;
   a fifth field effect transistor having its gate connected to the gate of said first field effect transistor and its first current conducting terminal connected to the gate of said second field effect transistor.

8. The circuit of claim 7 wherein the second current conducting terminal of said fifth field effect transistor is connected to said second input node.

9. The circuit of claim 7 further including an inverter circuit connected between said second input node and said first input node, whereby signals applied to said second input node are inverted and applied to said first input node.

10. The circuit of claim 7 further including a bootstrap stage comprising serially connected sixth and seventh field effect transistors, the gate of said sixth transistor being capacitively coupled to the common node between said sixth and seventh transistors, said gate also being connected to the gate of said first field effect transistor, and the gate of said seventh transistor being connected to the gate of said second field effect transistor.

11. The circuit of claim 10 further including enhanced capacitances between the first current conducting terminals of said third and fourth field effect transistors and their respective gates.

12. The circuit of claim 11 further including an eighth field effect transistor having its current conducting terminals serially connected in said feedback path and its gate connected to a fixed bias.

13. The circuit of claim 12 further including a ninth field effect transistor having its current conducting terminals connected between a fixed bias and the gate of said fourth field effect transistor and its gate connected to said output node.

* * * * *